(12) United States Patent
Ungar et al.

(10) Patent No.: US 7,038,307 B2
(45) Date of Patent: May 2, 2006

(54) SEMICONDUCTOR CHIP WITH FIB PROTECTION

(75) Inventors: Franz Ungar, Munich (DE); Gunter Schmid, Hemhofen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/846,483

(22) Filed: May 13, 2004

(65) Prior Publication Data

US 2005/0023649 A1 Feb. 3, 2005

Related U.S. Application Data

(63) Continuation-in-part of application No. PCT/DE02/03968, filed on Oct. 21, 2002.

(30) Foreign Application Priority Data

Nov. 14, 2001 (DE) ............... 101 55 802

(51) Int. Cl.
*H01L 23/02* (2006.01)
(52) U.S. Cl. ............... 257/679
(58) Field of Classification Search ............... 257/679, 257/642
See application file for complete search history.

(56) References Cited

U.S. PATENT DOCUMENTS

| 4,491,605 | A | | 1/1985 | Mazurek et al. | |
|---|---|---|---|---|---|
| 4,868,489 | A | | 9/1989 | Kowalski | |
| 5,114,780 | A | * | 5/1992 | Mercer et al. | 428/195.1 |
| 5,119,173 | A | * | 6/1992 | Queen et al. | 257/687 |
| 5,247,050 | A | * | 9/1993 | Hendricks | 528/125 |
| 5,298,884 | A | * | 3/1994 | Gilmore et al. | 340/573.4 |
| 5,406,630 | A | * | 4/1995 | Piosenka et al. | 380/52 |
| 5,861,652 | A | | 1/1999 | Cole et al. | |
| 5,959,157 | A | | 9/1999 | Lau et al. | |
| 5,965,679 | A | * | 10/1999 | Godschalx et al. | 526/281 |
| 6,121,495 | A | * | 9/2000 | Babb et al. | 568/17 |
| 6,798,234 | B1 | * | 9/2004 | Laackmann et al. | 326/21 |
| 2002/0126792 | A1 | * | 9/2002 | Fuhrmann et al. | 377/1 |
| 2003/0218475 | A1 | * | 11/2003 | Gemmel | 326/8 |

FOREIGN PATENT DOCUMENTS

| DE | 10044837 | 9/2001 |
|---|---|---|
| EP | 1109220 | 6/2001 |
| WO | WO 97/10193 | 3/1997 |
| WO | WO 98/11149 | 3/1998 |

OTHER PUBLICATIONS

Technical Disclosure Bulletin, vol. 34, No. 10A, Mar. 1992, "One-Step Technique to Achieve Polyimide Planarization and via Formation Using a Resist and Plasma Etch Process". International Search Report Issued in PCT/DE02/03968.

* cited by examiner

*Primary Examiner*—Nathan J. Flynn
*Assistant Examiner*—Benjamin P. Sandvik
(74) *Attorney, Agent, or Firm*—Darby & Darby

(57) ABSTRACT

The present disclosure is directed to a semiconductor chip having protection against focused ion beam (FIB) attack. The semiconductor chip includes a conductor structure connected to a dielectric material, which has the property of giving rise, when ions are introduced, to an electrical conductivity which is sufficient for circuit-related connection of the conductors. When such a dielectric material is irradiated with ions, its electrical conductivity increases so that the electronic circuit integrated in the chip registers the electrical connection generated in this way between the conductors adjoining the dielectric material. Organic materials having a $\pi$-system are suitable for use as the dielectric material.

10 Claims, 8 Drawing Sheets

FIG 1
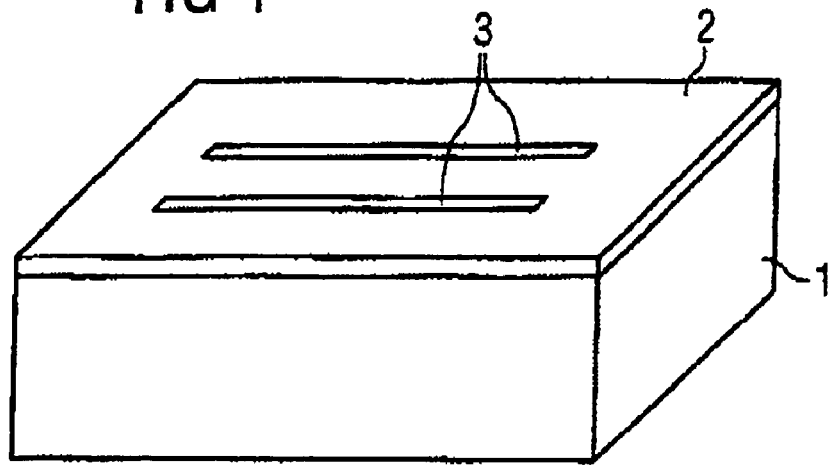
FIG 2
FIG 3    FIG 4
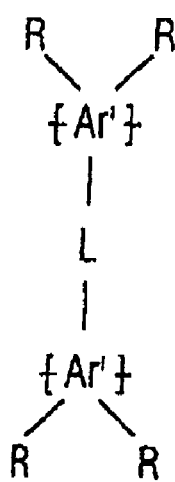
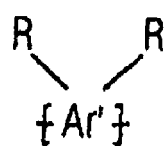

polybenzoxazoles

Polyimides benzene  naphthalene furan  thiophene  pyrrole  oxazole  thiazole  imidazole  isoxazole  isothiazole  pyrazole benzo [b] furan  benzo [b] thiophene  indole  2H-isoindoles  benzothiazole pyridine  pyrazine  pyrimidine  α-pyrones  γ-pyrones quinoline  iso-quinoline  bipyridine & derivatives (0-2$X_i$/Ring=N)

SEMICONDUCTOR CHIP WITH FIB PROTECTION

CROSS-REFERENCE TO RELATED APPLICATION

This application is a continuation-in-part of International Patent Application No. PCT/DE02/03968, filed Oct. 21, 2002, which published in German on Jun. 5, 2003 as WO 03/046985 and claims the benefit of German Patent Application No. 10155802.3, filed Nov. 14, 2001, each of which is incorporated herein by reference in its entirety.

FIELD OF THE INVENTION

The present invention relates to a semiconductor chip having protection against focused ion beam (FIB) attack. In particular, the invention relates to chip cards having protection against FIB attack.

BACKGROUND OF THE INVENTION

Semiconductor chips which are used in chip cards, for example credit or payment cards, telephone cards and the like, are susceptible to attacks for decoding the memory contents or the functions of the chip. Such attacks commonly occur by an FIB technique, in which a focused ion beam is directed onto the chip. The impact of the ions from the ion beam ablates the layers of the semiconductor chip, thereby allowing the layer-wise structure of the chip to be studied. A surface-wide metal coating to the chip offers passive protection against FIB this.

Polymers having extended π-systems are the basis for organic semiconductors. Such dielectrics can therefore be regarded as organic semiconductors having an extremely low charge-carrier mobility. The ohmic conductivity of dielectrics based on polymers having extended π-systems increases by orders of magnitude when they are doped.

Polyaromatics, as described for example in International Publication Nos. WO 97/10193 and WO 98/11149, polyimides, polybenzoxazoles, polyimidazoles or polyethers are primarily used as dielectrics having extended π-systems. The polymer backbone may contain further heteroatoms, for example sulphur.

Irradiation of the dielectric by means of ions, as occurs during an FIB analysis, leads to a local increase in the ohmic conductivity by orders of magnitude. The dielectric becomes irreversibly doped by this.

German Patent No. DE 100 44 837 C1 describes a circuit arrangement for detecting an undesired attack, and especially one using FIB, on an integrated circuit, in which a clock signal is applied to a signal line. The signal line and a line pair, which is used for encoding a bit, are interconnected between two circuit blocks of the integrated circuit, and are connected to a detector circuit which changes the functionality of the integrated circuit as a function of the signals on the signal line and the line pair.

European Patent Publication No. EP 1 109 220 A2 and IBM Technical Disclosure Bulletin 34, 366 (1992) disclose polybenzoxazole and polyimide as a dielectric material for, respectively, electrical installation and passivation on semiconductor components.

It is an object of the present invention to provide a semiconductor chip having FIB protection, which can be used universally.

SUMMARY OF THE INVENTION

The present invention provides a semiconductor chip comprising a conductor structure having at least two conductors embedded in a dielectric material on a substrate. When ions are introduced (doping), the electrical conductivity of the conductor structure rises sufficiently for circuit-related connection of the conductors. This involves the use of dielectric materials which have extended π-systems, such as those containing multiple aromatics or heteroatoms. If such a dielectric material is irradiated with ions, its electrical conductivity increases so that the electronic circuit integrated in the chip registers the electrical connection generated between the electrical conductors adjoining the dielectric material. An FIB attack may be inferred in this situation.

BRIEF DESCRIPTION OF THE DRAWINGS

FIG. 1 shows a diagram of an example of a semiconductor chip according to the present invention.

FIGS. 2 to 16 show structural chemical formulae of dielectric materials, or components thereof, suitable for use in the present invention.

DETAILED DESCRIPTION OF THE INVENTION

FIG. 1 schematically represents an exemplary embodiment of a semiconductor chip. Electrical conductors (3) are provided, between which there is a dielectric material (2) made of an organic material having at least one π-system. The dielectric material layer is applied to a semiconductor body or a substrate (1) on or in which electronic circuit components are integrated. The electrical conductors (3) are arranged as conductive tracks within the dielectric material layer. Alternatively, the electrical conductors (conductive tracks) may be arranged above and below the dielectric layer. Examples of suitable dielectric materials are shown in FIGS. 2 to 16. Crosslinked aromatic hydrocarbons are particularly preferred.

If a focused ion beam is directed onto the dielectric layer (2), the ions which are introduced cause doping of the dielectric material in the irradiated region. The dielectric material becomes electrically conductive in the vicinity of the irradiation and produces an electrical connection between the adjoining conductors (3). Suitable circuit logic in the semiconductor chip may be provided in order to detect or report an increase in the conductivity of the material between the conductive tracks, or to initiate possible countermeasures.

Dielectric materials suitable for use in the present invention obtain an irreversible ohmic conductivity when a small dose of ions is introduced. If the energy supply is so great that the chemical bonding per se is destroyed, graphite will be left behind. This is true of all organic materials when heated to sufficiently high temperatures in a vacuum, except when they are exposed to atmospheric oxygen and burn. In either case, therefore, the functionality of the integrated circuit can be permanently impaired or destroyed in the event of an FIB attack.

Dielectrics which may be used according to the invention include the chemical compounds having the formula shown in FIG. 2. In this figure, Ar is an aromatic group, which may have one or more inert substituents. In this context, inert means that the substituent does not enter into any reaction, or at least does not have a substantial and detrimental effect on the properties of the compound formed with it, and in particular remains inert during a subsequent polymerization and with respect to solvents used during the polymerization. Each individual R is, independently of the other Rs, hydrogen, an alkyl or an aryl; L is a covalent bond, or a group which links one Ar to another Ar; n and m are integers greater than one; q is a positive integer.

Figure 6:
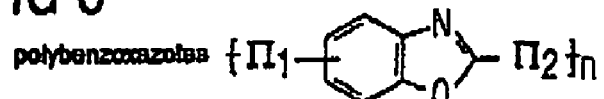
Figure 6:
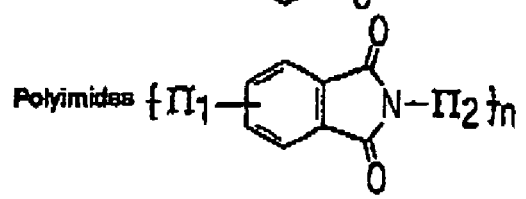
Figure 7:
Figure 7:
Figure 7:
Figure 7:
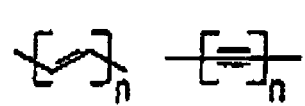
Figure 7:
Figure 7:
Figure 7:
Figure 7:
Figure 7:
Figure 7:
Figure 7:
Figure 7:
Figure 7:
Figure 7:
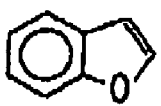
Figure 7:
Figure 7:
Figure 7:
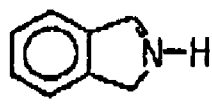
Figure 7:
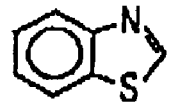
Figure 7:
Figure 7:
Figure 7:
Figure 7:
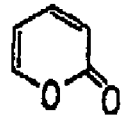
Figure 7:
Figure 7:
Figure 7:
Figure 7:
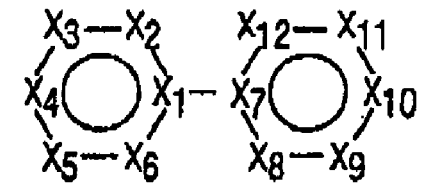

The polybenzoxazoles or polyimides shown in FIG. 6 may also constitute the component Ar, wherein each n is independently a positive integer Examples of the groups which may be contained in the independent π-systems $\pi_1$ and $\pi_2$ are shown in FIG. 7.

Figure 5:
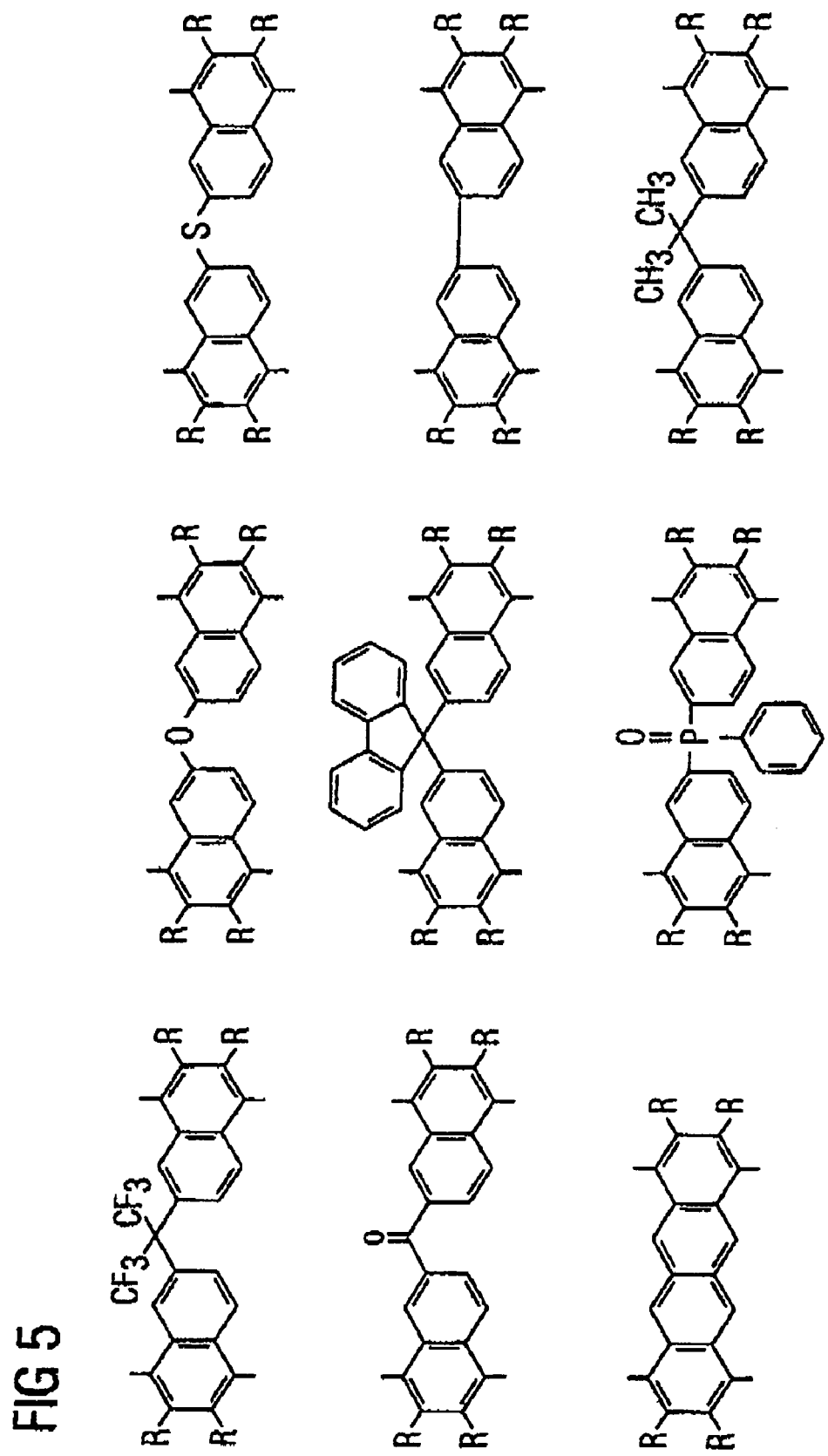

Polymers which have a structure according to FIG. 3 are also suitable as dielectric materials. In this figure, Ar' is a reaction residue of $(C\equiv C—)_n Ar$ or $Ar(—C\equiv C)_m$. Suitable examples are described in International Publication Nos. WO 97/10193 and WO 98/11149, each of which is incorporated herein by reference in its entirety. In FIG. 3, each individual R is, independently of the other Rs, hydrogen, an alkyl or an aryl; L is a covalent bond, or a group which links one Ar to another Ar; and n and m are integers greater than one. Examples of such polymers are shown in FIG. 5. The structural formula in FIG. 3 may be linked to the structural formula in FIG. 4 to form a copolymer. The symbols and indices in FIG. 4 have the same definitions as in FIG. 3.

Figure 8:
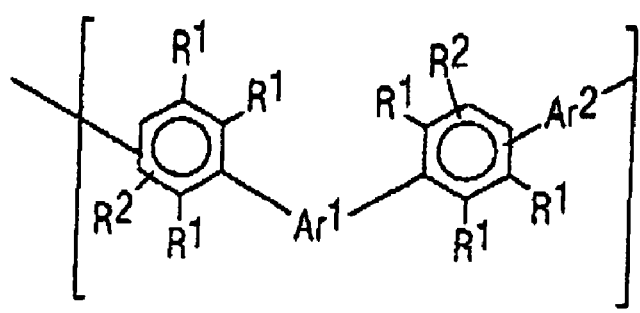
Figure 9:
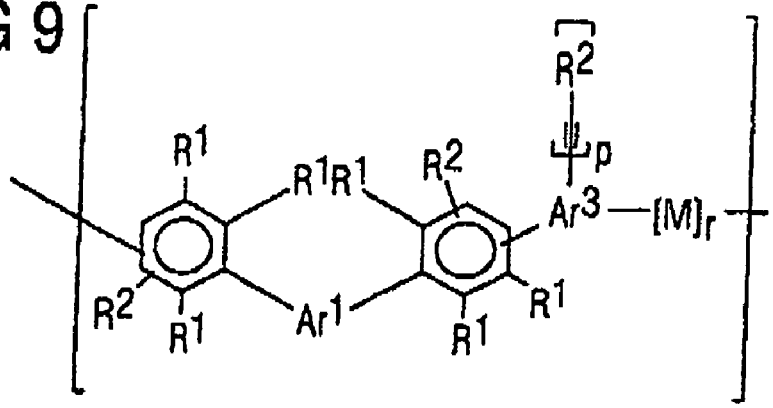
Figure 10:
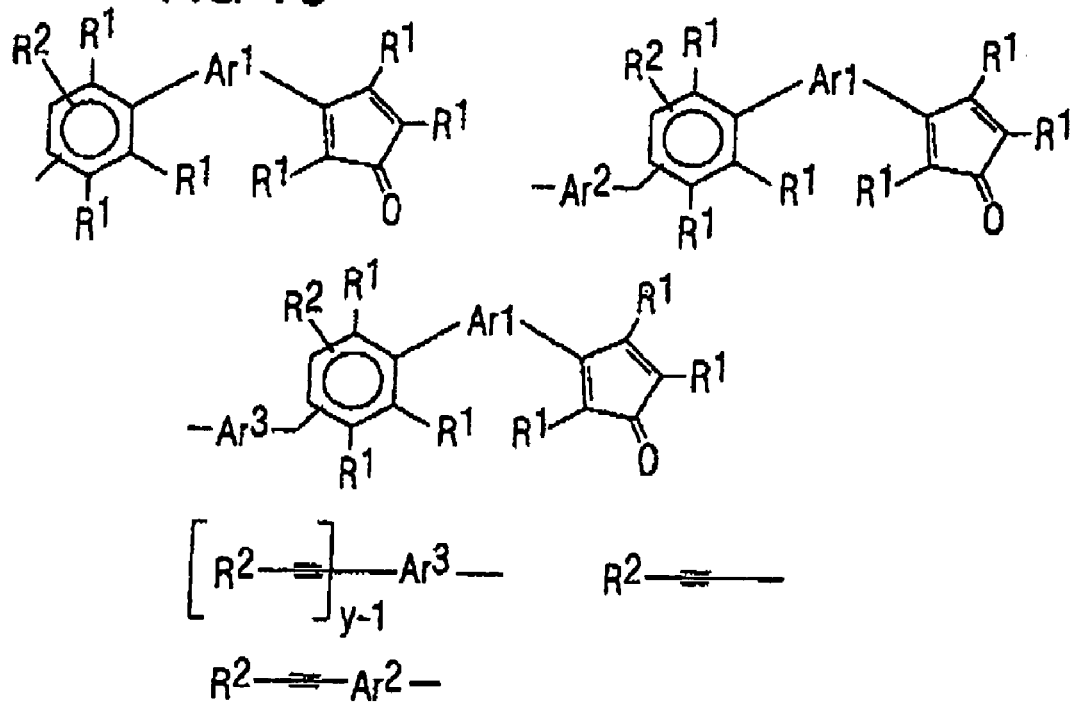
Figure 11:
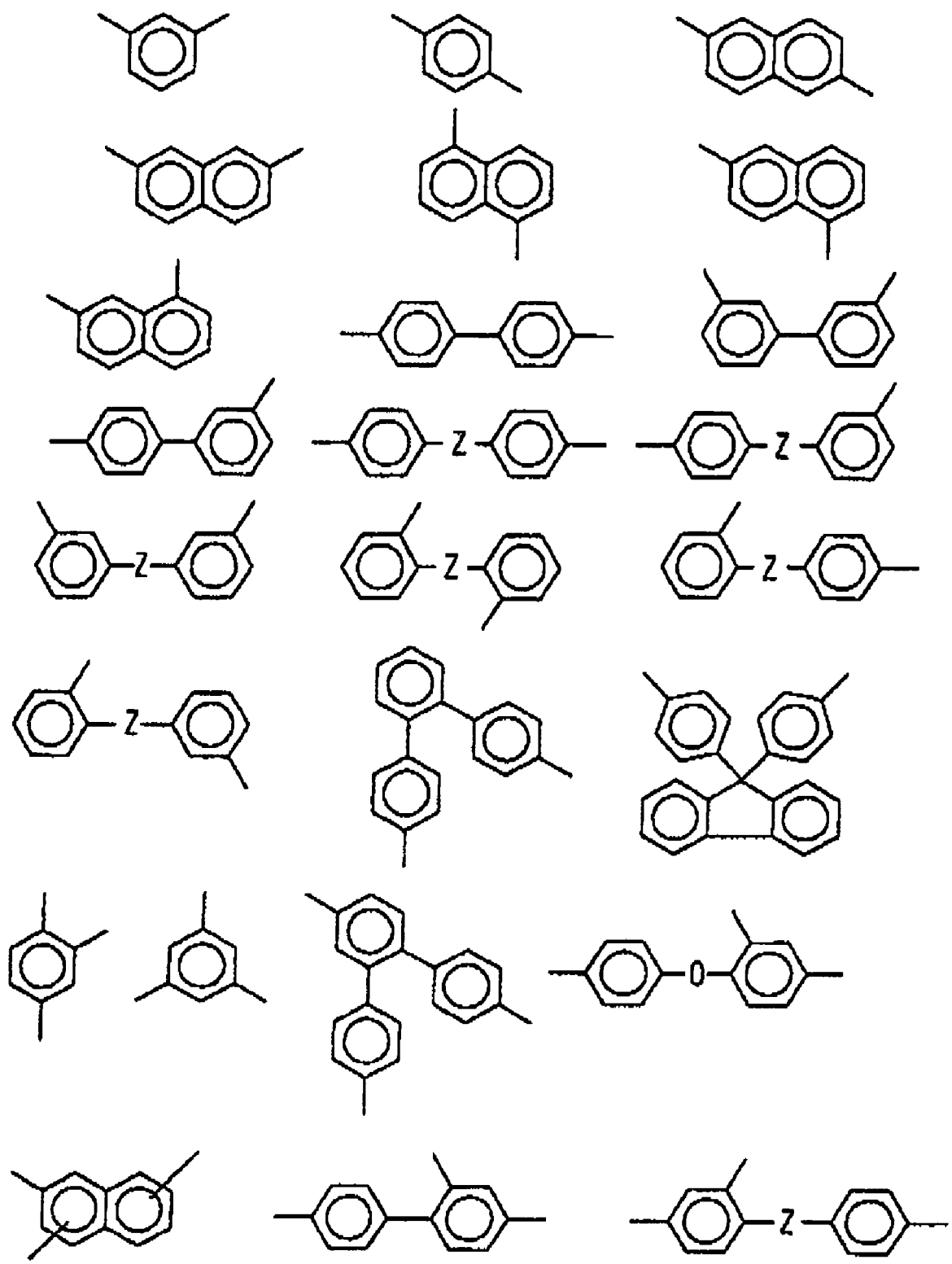
Figure 12:
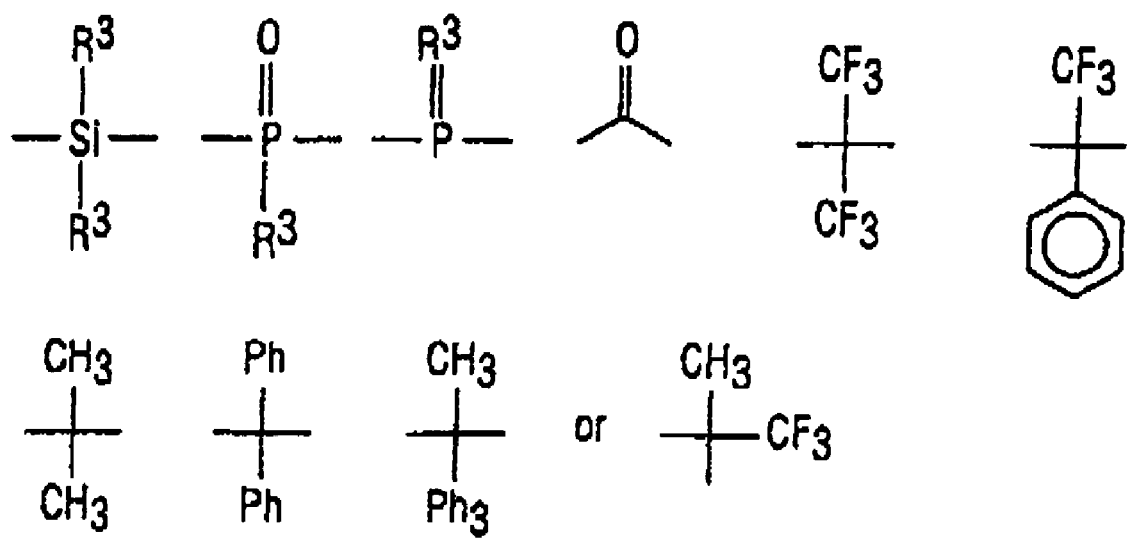

Further examples of suitable dielectric materials for use in the present invention are oligomers and polymers of the general formula $[A]_w[B]_z[EG]_v$. In this formula, the component A has the structure shown in FIG. 8, the component B has the structure shown in FIG. 9, and the component EG comprises one or more of the structures shown in FIG. 10. In FIGS. 8–10, $R^1$ and $R^2$ are, independently of one another, H or an aromatic group which is unsubstituted or has an inert substituent. Examples of suitable aromatic groups include those shown in FIG. 11, wherein Z is selected from O, S, alkylene, $CF_2$, $CH_2$, $O—CF_2$, perfluoroalkyl, perfluoroalkoxy or a structure shown in FIG. 12 (where $R^3$ is, each independently of the other, H, $CH_3$, $CH_2CH_3$, $(CH)_2CH_3$ or phenyl and Ph is phenyl). In FIGS. 8–10, $Ar^1$, $Ar^2$ and $Ar^3$ are, independently of one another, an aromatic group which is unsubstituted or has an inert substituent (for example a group likewise selected from the structures listed in FIG. 11); M is a linkage; y is an integer greater than two; p is the number of acetylene groups in the relevant mer unit which have not entered into any reaction; r is one less than the number of acetylene groups in the relevant mer unit which have entered into a reaction; p+r=y−1; w and z are each an integer of from 0 to 1000; and v is an integer greater than one.

Figure 13:
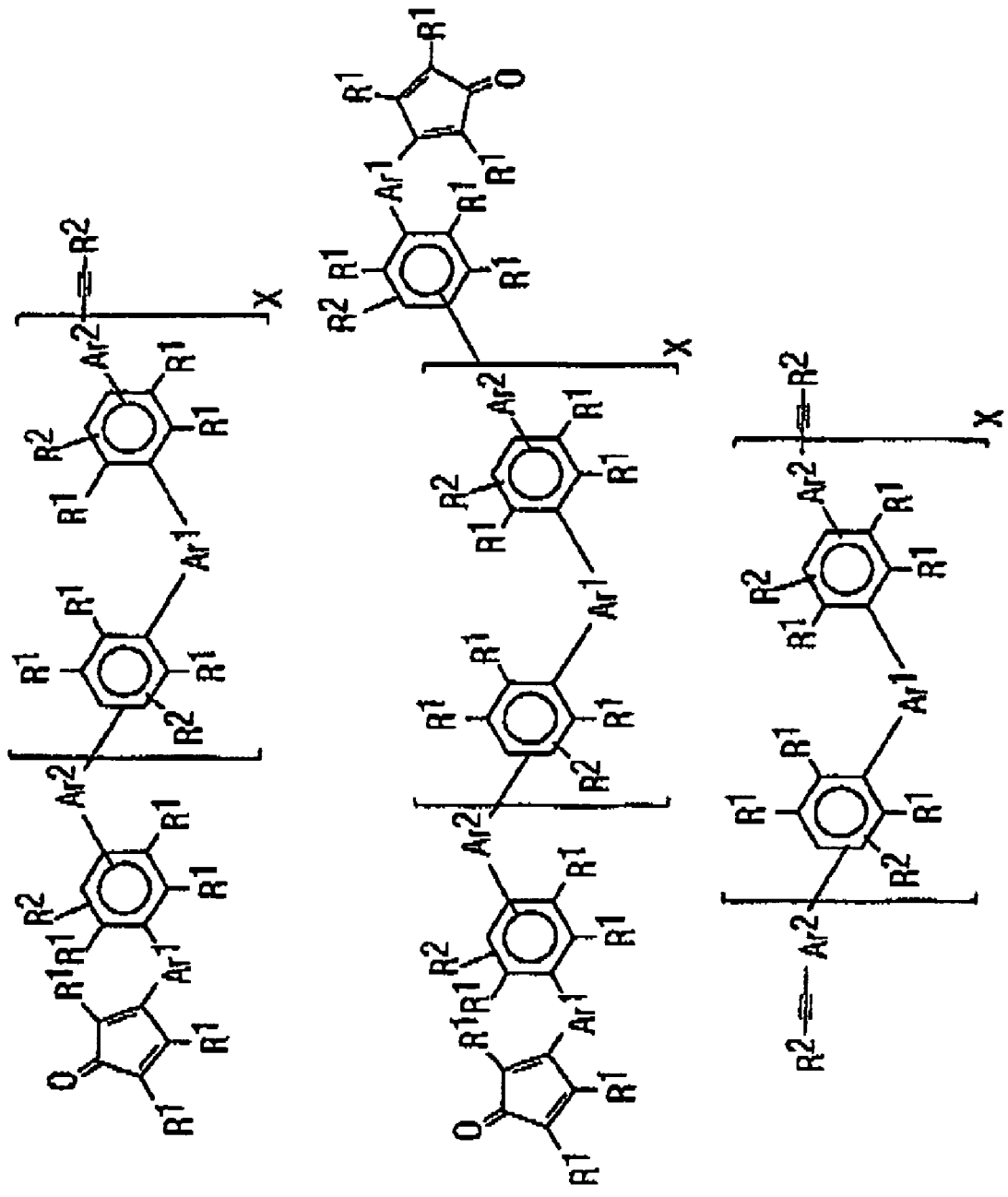
Figure 14:
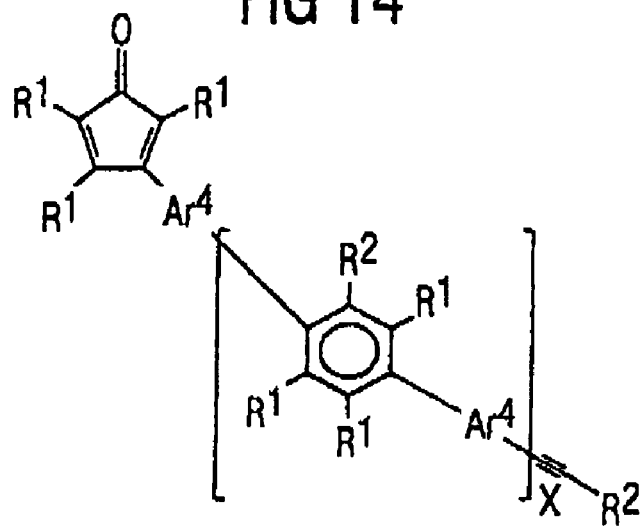

Further examples of dielectric materials suitable for use in the present invention are the polyphenylene oligomers and polyphenylene polymers shown in FIG. 13, in which the symbols and indices have the definitions as indicated above (previous paragraph) and x is integer of from 1 to 1000, as well as the polyphenylene oligomers and polyphenylene polymers shown in FIG. 14, in which $Ar^4$ may be selected from the same structures as were indicated above for $Ar^1$, $Ar^2$ and $Ar^3$, and x is an integer of from 1 to 1000.

Figure 15:
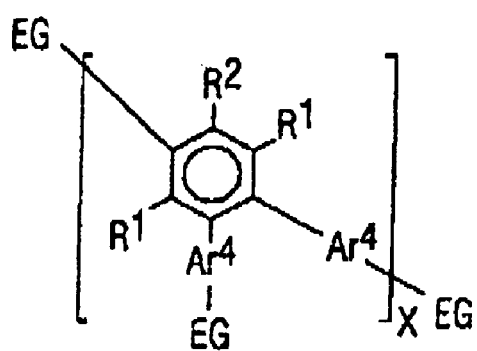
Figure 16:
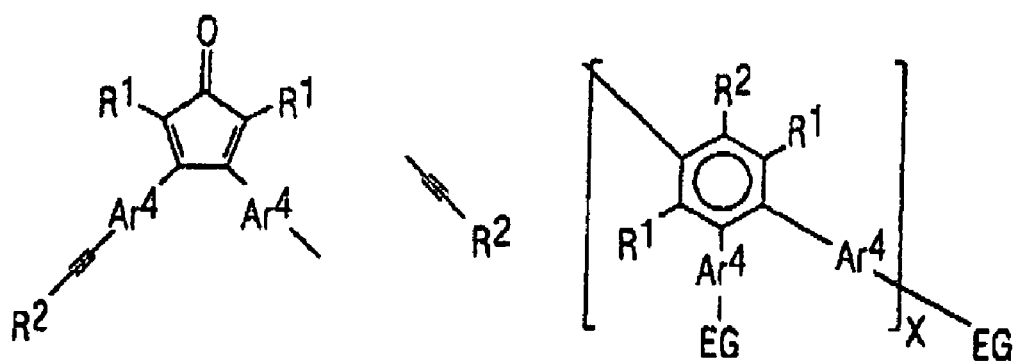

Further examples of dielectric materials are the polyphenylene oligomers and polyphenylene polymers shown in FIG. 15, in which EG is one of the structures shown in FIG. 16 and the symbols and indices have the same meaning as in the two previous paragraphs.

EXAMPLE

In a specific configuration of the semiconductor chip, a 500 nm thick layer of a polyaromatic dielectric was applied and cured. In this dielectric, conducting layers lying next to one another with a width of 250 nm, a spacing of 200 nm and a length of 1 mm were etched with a curing mask and a reactive ion plasma. After the deposition of a starter coat of titanium nitride (TiN) and copper, electrolytic thickening was carried out and excess copper was removed by means of CMP (chemical mechanical polishing).

Electrical measurements on this semiconductor chip showed no significant ohmic conduction between the conductive tracks. The dielectric was exposed in an FIB device to gallium ions with an acceleration voltage of 50 keV. A reduction in the resistance between the conductive tracks was then observed. An acceleration voltage of as little as 30 keV would have been sufficient.

What is claimed is:

1. A semiconductor chip having FIB protection comprising: an integrated electronic circuit:
   a dielectric material; and
   at least two more electrical conductors, which are separated from one another by the dielectric material, and are connected to the integrated electronic circuit;
   wherein when ions are introduced into the dielectric material, the electrical conductivity of the dielectric material increases sufficiently for circuit-related connection of the electrical conductors, and the integrated electronic circuit detects a FIB attack by detecting an increase in the electrical conductivity of the dielectric material.

2. The semiconductor chip according to claim 1, wherein the electrical conductivity of the dielectric material increases under the effect of a focused ion beam used in an FIB technique.

3. The semiconductor chip according to claim 1, wherein the dielectric material is an organic material having at least one π-system.

4. The semiconductor chip according to claim 3, wherein the organic material is a polyimide or a polyaromatic.

5. The semiconductor chip according to claim 3 wherein the organic material is a polybenzoxazole.

6. The semiconductor chip according to claim 3, wherein the dielectric material has the structure:

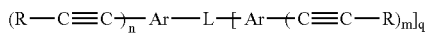

wherein
   each R is independently selected from hydrogen, alkyl, and an aromatic group;
   L is a covalent bond, or a group linking Ar to the other Ar;
   each Ar is an optionally substituted aromatic group;
   n and m are independently integers greater than 1; and
   q is a positive integer.

7. The semiconductor chip according to claim 3, wherein the dielectric material is a polymer comprising monomers having the formula:

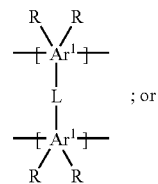

a copolymer comprising monomers having the formulas:

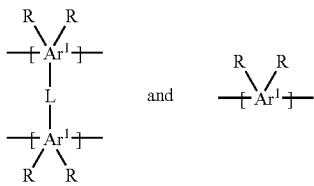

wherein
wherein each R is independently selected from hydrogen, alkyl, or an aromatic group;

L is a covalent bond, or a group linking one Ar' to the other Ar';

each $Ar^1$ is independently $(C\equiv C-)_n Ar$ or $Ar(-C\equiv C)_m$;

each Ar is an optionally substituted aromatic group; and n and m are independently integers greater than one.

8. The semiconductor chip according to claim 7, wherein the dielectric material is a polymer or copolymer comprising one or more compounds selected from:

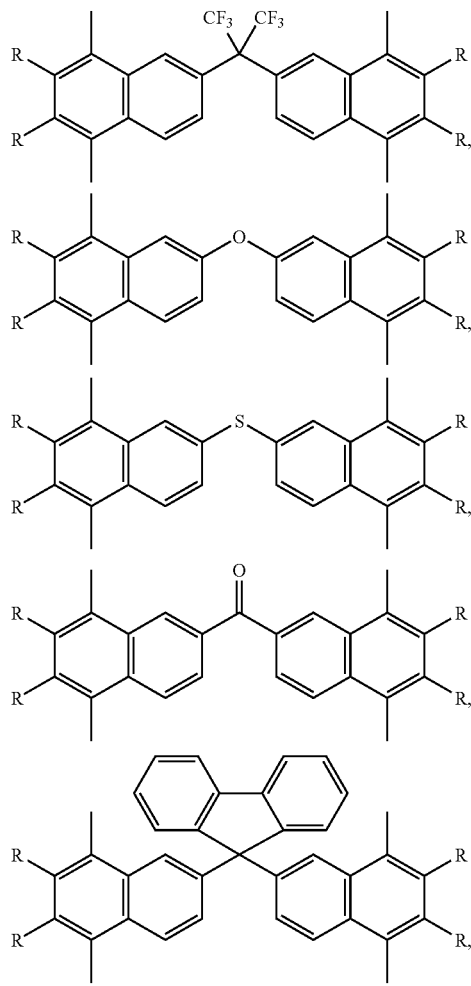

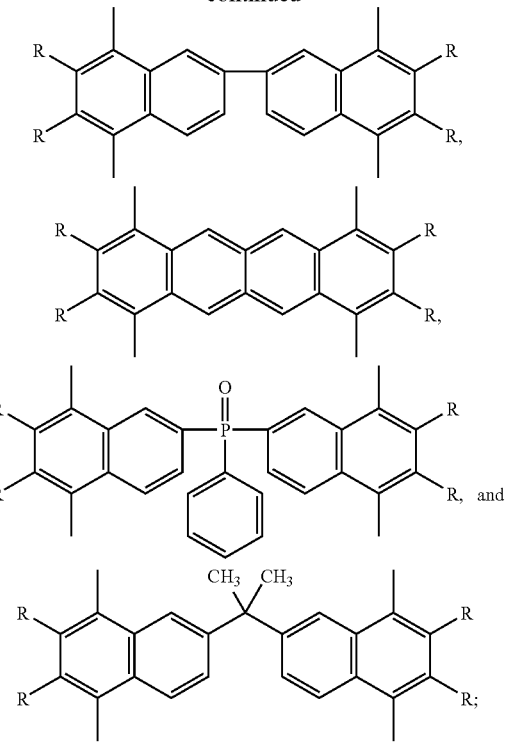

wherein
each R is independently selected from hydrogen, alkyl, and an aromatic group.

9. The semiconductor chip according to claim 3, wherein the dielectric material comprises a compound of the formula $[A]_w[B]_z[EG]_v$, wherein
A is represented by the formula:

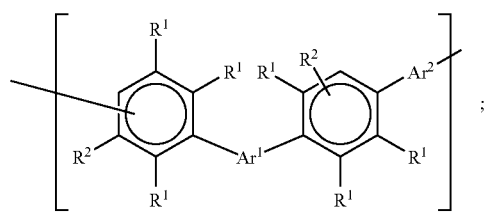

B is represented by the formula:

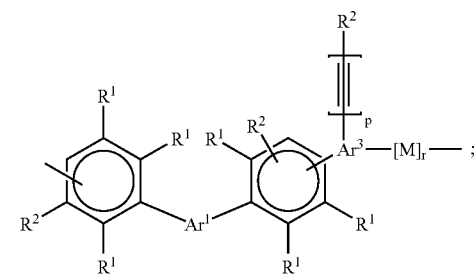

EG is represented by the formula:

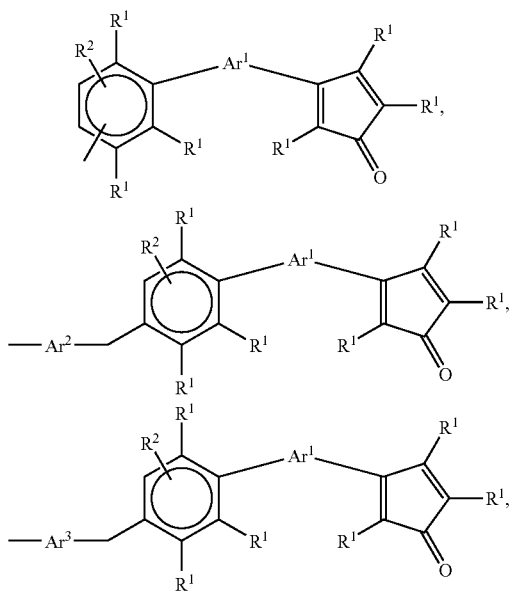

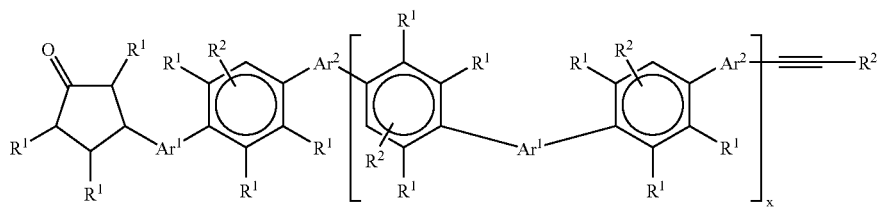

wherein
each occurrence of $R^1$ and $R^2$ is independently selected from hydrogen and a substituted or unsubstituted aromatic group;
$Ar^1$, $Ar^2$, and $Ar^3$ are independently a substituted or unsubstituted aromatic group;
each Ar is an optionally substituted aromatic group;
n and m are independently integers greater than one;
w and z are independently integers from 1 to 1000;
v is an integer greater than 1;
y is an integer greater than 2;
r is one less than the number of acetylene groups in the relevant mer unit that have entered into a reaction;
M is a linker; and p+r=y−1.

10. The semiconductor chip according to claim 3, wherein the dielectric material is a polyphenylene oligomer or a polyphenylene polymer selected from:

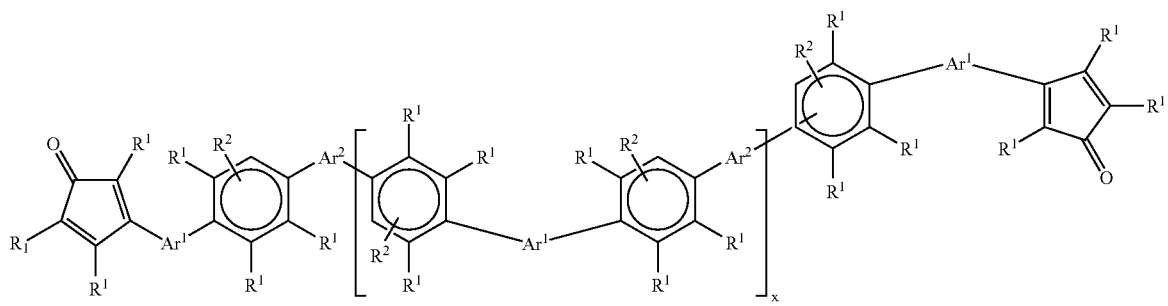

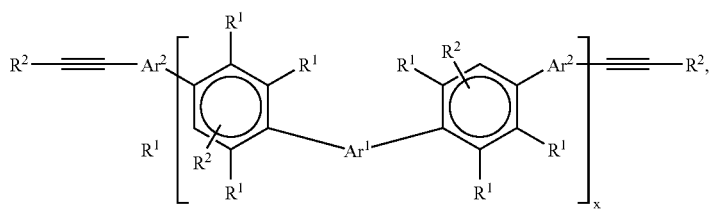

-continued
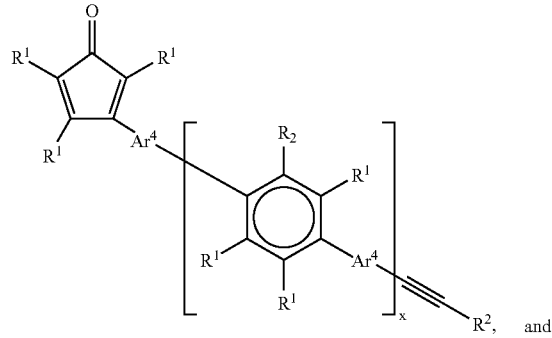
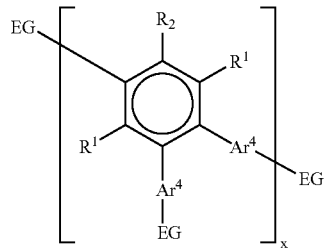
wherein
R[1] and R[2] are independently selected from hydrogen and a substituted or unsubstituted aromatic group;
each Ar[1], Ar[2], Ar[3], and Ar[4] is independently a substituted or unsubstituted aromatic group;
each EG is independently selected from:
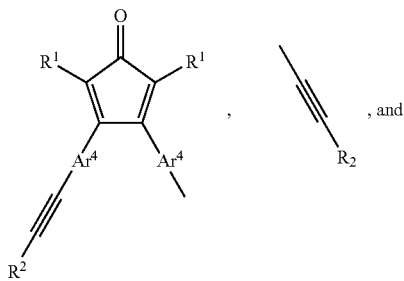 , and
-continued
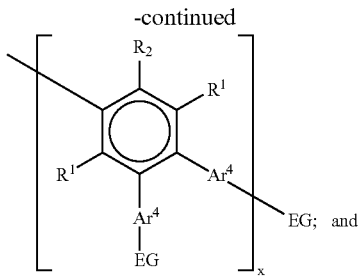
each x is independently an integer from 1 to 1000.
* * * * *